United States Patent [19]

Duggan

[11] Patent Number: 4,999,211

[45] Date of Patent: Mar. 12, 1991

[54] APPARATUS AND METHOD FOR MAKING A PHOTOCATHODE

[75] Inventor: Daniel D. Duggan, Roanoke, Va.

[73] Assignee: ITT Corporation, New York, N.Y.

[21] Appl. No.: 411,079

[22] Filed: Sep. 22, 1989

[51] Int. Cl.[5] .............................................. H01L 31/18

[52] U.S. Cl. ...................................... 427/8; 427/74; 118/668; 324/158 F

[58] Field of Search ........................ 445/63, 58, 73, 10; 427/8, 74; 118/668; 324/158 F, 158 P

[56] References Cited

U.S. PATENT DOCUMENTS

| | | | |
|---|---|---|---|
| 4,101,824 | 7/1978 | Breedlove et al. | 324/158 F |
| 4,306,188 | 12/1981 | Ibaugh | 445/10 X |
| 4,407,857 | 10/1983 | Butterwick | 445/10 X |
| 4,526,802 | 7/1985 | Sato | 427/8 |

*Primary Examiner*—Kenneth J. Ramsey

*Attorney, Agent, or Firm*—Arthur L. Plevy

[57] ABSTRACT

Apparatus for applying an activation layer to a photoemissive wafer of a photocathode, the photocathode having an electrically conductive layer surrounding a portion of its outer surface and contacting the photoemissive layer. A split-ring holder made of a conductive material is placed in a non-conductive support. The support is positioned in a metallic tray and the tray is located in the center of a rotatable carousel in a vacuum chamber. A photocathode is placed in the split-ring holder with its conductive layer contacting both sections of the holder. Electrical current is applied to one section of the split ring and a fork is touched to the other section of the split ring to determine if contact is being made between the conductive layer and the holder. Once it is determined that contact is being made, deposition of the activation layer begins.

13 Claims, 4 Drawing Sheets

APPARATUS AND METHOD FOR MAKING A PHOTOCATHODE

BACKGROUND OF THE INVENTION

This invention relates to image intensifier devices and more particularly to a method of manufacturing gallium arsenide photocathodes.

Image intensifier devices multiply the amount of incident light they receive and thus provide an increase in light output which can be supplied to a camera or directly to the eyes of a viewer. These devices are particularly useful for providing images from dark regions and have both industrial and military application.

The image intensifier device utilizes a photoemissive wafer which is bonded to a glass faceplate to form a photocathode. Light enters the faceplate and strikes the wafer, thereby causing a primary emission of electrons. The electrons are accelerated across a gap by an electric field to a microchannel plate. The microchannel plate amplifies the initial electron current from the cathode by approximately 300 times. A phosphor layer deposited on an output window functions as an anode.

At the bonding stage, the photoemissive wafer has three major layers, namely, a silicon nitride ($Si_3N_4$) antireflection layer, a gallium aluminum arsenide "window" layer and a gallium arsenide active layer. A silicon dioxide ($SiO_2$) layer deposited on the silicon nitride layer provides an interface between the wafer and the faceplate during bonding.

After the bonding step, a metallic conductive layer is applied to a portion of the outer surface of the photocathode. The photocathode is then heat cleaned to remove contaminants, such as oxygen and carbon, from the gallium arsenide layer.

A major step in the processing of the photocathode is an activation step. The activation step includes the deposition of cesium oxide on the outer gallium arsenide layer of the wafer, thereby reducing the work function and permitting the electrons to be more easily released from the gallium arsenide layer.

The cathodes are placed inside a vacuum system during the deposition stage. Electrical contact is made to the metallic conductive layer of the cathode to monitor the photo response of the cathode during deposition. If no photoemission is detected, the process is aborted and the photocathode scrapped resulting in considerable expenditure of time and money.

Failure of the deposition process may result from one or more reasons. Three major reasons are (1) the cathode is contaminated, (2) cesium is not being released into the vacuum system and (3) electrical contact is not being made to the conductive layer. Elimination of any one of the reasons would result in a considerable saving in manufacturing cost and effort. Up to now it has been nearly impossible to determine the specific reason or reasons for deposition failure, thereby resulting in the discarding of cathodes which could otherwise have been used.

It is therefore an object of the present invention to provide an apparatus for eliminating one cause of photo response failure during activation of a photocathode.

It is an additional object of the present invention to provide a method of performing an activation step which provides increased production of photocathodes and savings in manufacturing costs.

SUMMARY OF THE INVENTION

These objects and others which will become apparent hereinafter are accomplished by the present invention which provides an apparatus for determining electrical continuity between a power source and a photocathode during a deposition process. The apparatus includes a holder for a photocathode having at least two sections composed of an electrically conductive material, the sections being electrically isolated from each other. The holder has a support formed of an electrically nonconductive material which electrically isolates the holder from a process tray in which the holder is positioned.

The invention also provides a method of forming an activation layer on a photocathode by determining the electrical conductivity between a photocathode holder and a source of power and, if such conductivity is present, depositing an activation layer on a gallium arsenide layer of the photoconductor.

BRIEF DESCRIPTION OF THE DRAWING

The above-mentioned and other features and objects of this invention will become more apparent by reference to the following description taken in conjunction with the accompanying drawing in which.

DESCRIPTION OF THE PREFERRED EMBODIMENT

Figure 1:
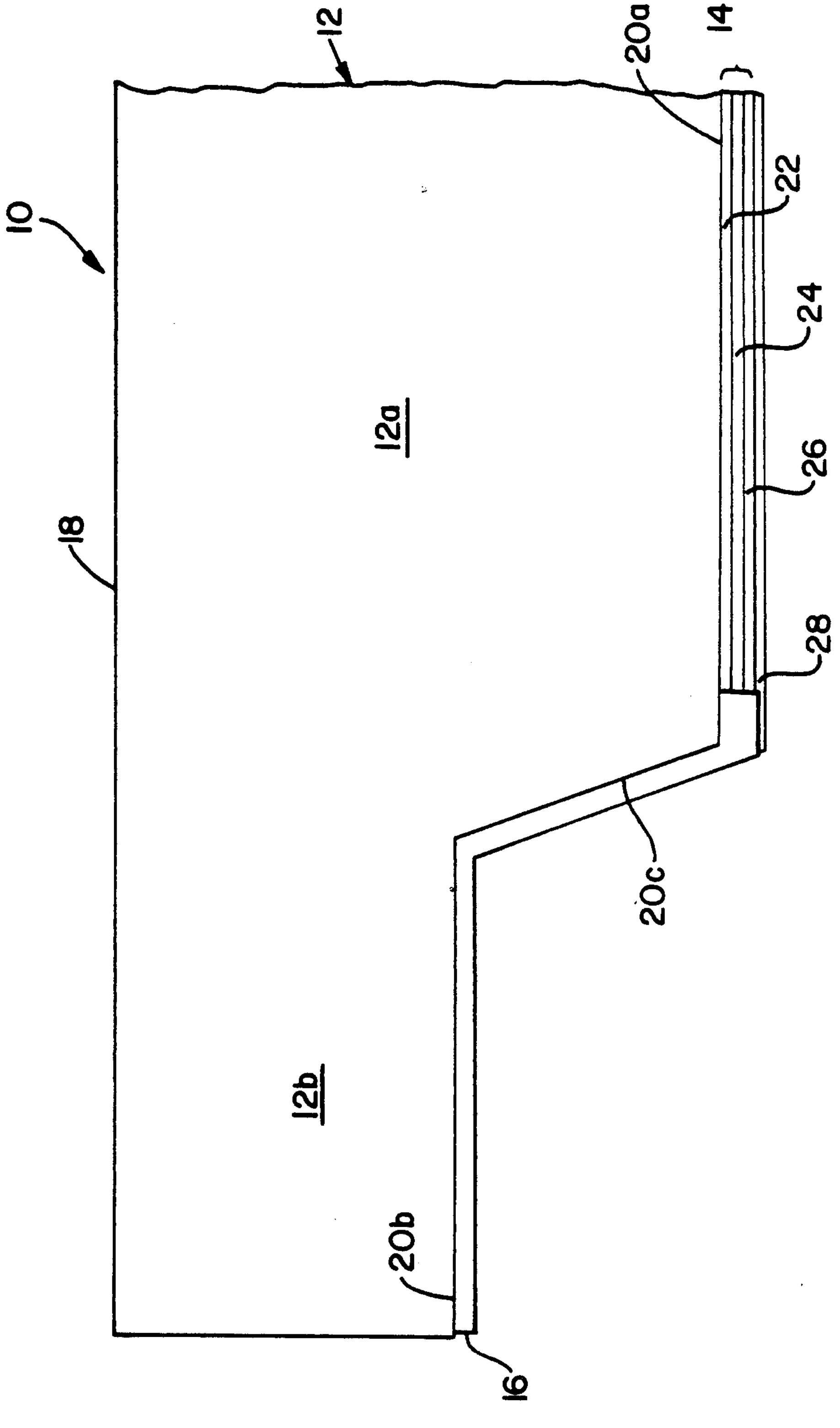
FIG. 1 is a cross-sectional view of a photocathode of the invention.

In FIG. 1 there is shown a photocathode 10 which includes three basic components, namely a faceplate 12, a photoemissive wafer 14 and a conductive contact layer 16. The faceplate 12 can be made of a clear, high quality optical glass such as Corning 7056. This glass comprises 70 percent silica ($SiO_2$), 17 percent boric oxide ($B_2O_3$), 8 percent potash ($K_2O$), 3 percent alumina ($Al_2O_3$) and 1 percent each of soda ($Na_2O$) and lithium oxide ($Li_2O$). Other glasses or fiber optics may be used. In shape, the faceplate 12 includes a central, generally circular body portion **12*a* and a reduced thickness sill portion 12*b* in the form of a flange surrounding the body portion. One surface 18 of the faceplate 12 extends continuously across the body and sill portions 12*a* and 12*b*** and is the surface on which input light impinges.

The faceplate 12 also includes surface portions **20*a* and 20*b* which are generally parallel to surface 18 and a connecting surface portion 20*c*** which, in the embodiment disclosed herein, is generally frusto-conical.

The photoemissive wafer 14 is bonded to the surface portion **20*a* so that light impinging on the surface 18 and eventually striking the wafer 14 causes the formation of electrons. These electrons are accelerated across a gap by an electric field to a microchannel plate (MCP), not shown, causing the secondary emission of electrons all in accordance with known principles. Connecting the photoemissive wafer 14 to an external biasing power supply (not shown) is the conductive contact layer 16 applied to the surfaces 20*b* and 20*c*** and also over a portion of surface 20a so that this layer makes contact with the wafer 14.

The photoemissive wafer 14 may be formed in any known manner. One such method is described in co-pending U.S. patent application Ser. No. 289,353, filed Dec. 23, 1988 in the name of R. E. Blank et al, entitled "Apparatus and Method for Heating Cleaning Semiconductor Material" and now U.S. Pat. No. 4,948,937. The portion of the patent application describing the formation of the photoemissive wafer is incorporated herein by reference.

The wafer 14 includes an antireflective layer 22 which is formed of silicon nitride ($Si_3N_4$), an window layer 24 formed of gallium aluminum arsenide (GaAlAs) deposited on the layer 22, and an active layer 26 formed of gallium arsenide (GaAs) deposited on the layer 24.

The conductive contact layer 16 is applied to the surface portions 20b and 20c and a small portion of 20a which is contiguous with 20c. The cathode 10 is then heat cleaned to remove contaminants from the surface of the wafer 14.

After the photocathode has cooled sufficiently, a layer 28 of cesium oxide (CsO) is deposited on the outer surface of the gallium arsenide layer 26.

Figure 2:
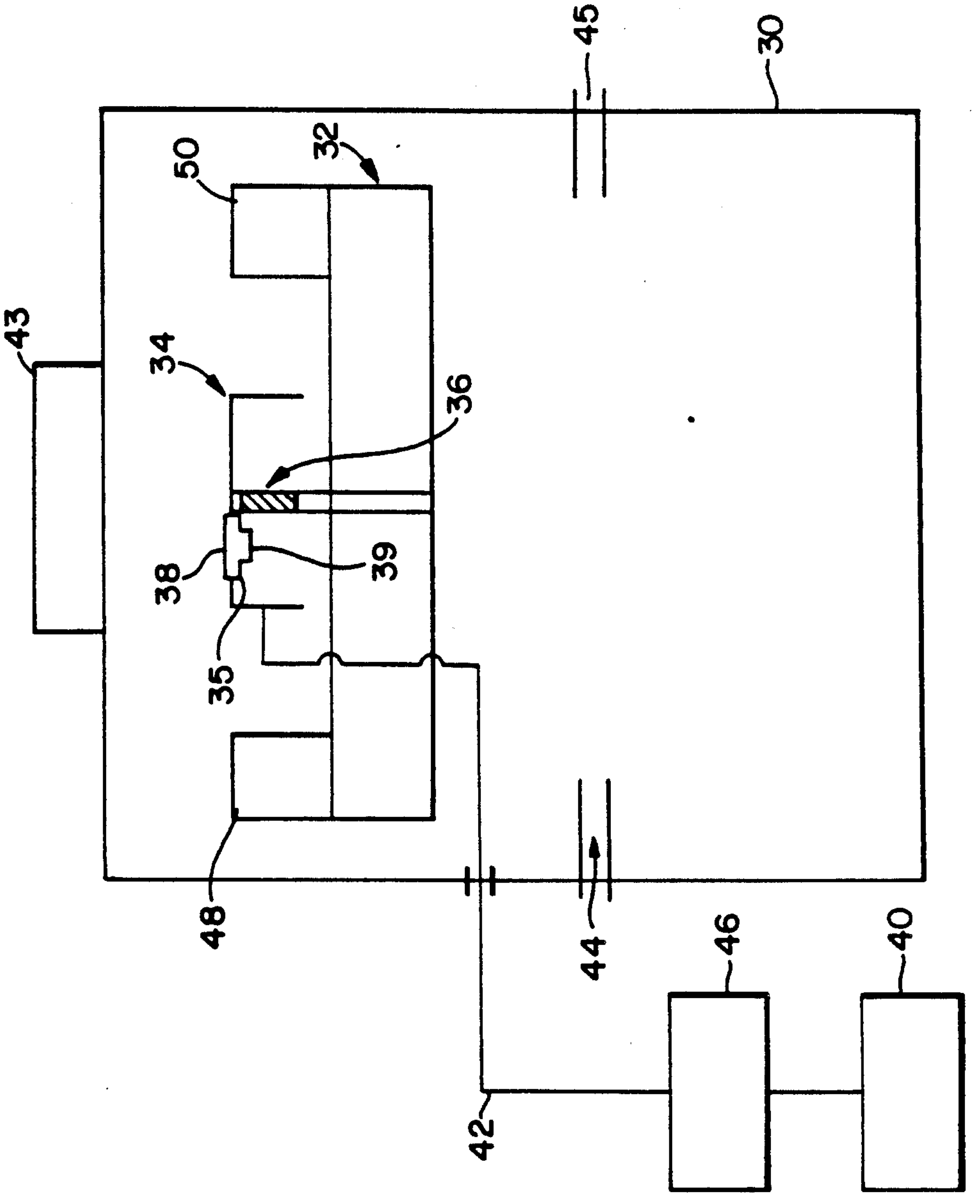
PRIOR ART FIG. 2
FIG. 2 is a diagrammatic view of a prior art deposition apparatus.

FIG. 2 illustrates in diagrammatic form a prior art apparatus used for deposition of a cesium oxide layer and for monitoring photoemissive current from a photocathode during such deposition.

A vacuum chamber 30 contains a rotating carousel 32 which is made of an electrically conductive material. The carousel 32 contains twelve body holders located around its outer periphery. Side views of two such body holders are shown at 48 and 50. Each body holder contains a complete image intensifier device except for the photocathode.

In the center of the carousel 32 is a process tray 34 in which a holder 35 supports a photocathode 38. The holder 35 and tray 32 are made of a metallic material so that they are electrically conductive. A ceramic stand 36 supports the tray 32 in the rotating carousel 32 and electrically isolates the tray 34 from the carousel 32. The photocathode 38 is placed in the holder 35 with its conducive contact layer 39 facing the carousel 32.

Electrical connection is made from a dc power source 40 to the tray 34 by means of an electrical connection 42 which enters a feed-through in a wall of the chamber 30. A photoresponse meter 46 is coupled to electrical connection 42 monitors photoemission from the photocathode during the deposition process. A light source 43 is positioned in a window of the chamber 30.

An inlet port 44 and an inlet port 45 feed cesium and oxygen, respectively, into the chamber 30.

The deposition process begins with the placing of one photocathode into the holder 35 in the vacuum chamber 30 through a gate valve (not shown). Air is evacuated from the chamber 38, and the temperature inside the chamber is elevated. The light source 44 is activated and is calibrated to emit approximately $1\times10^{-3}$ foot candles. The light enters the faceplate, and the electrons in the wafer become activated.

A cesium compound, such as cesium chromate, is chemically reacted, releasing cesium vapor into the inlet 44. A molecular beam of cesium enters the chamber 30 and is deposited on the gallium arsenide layer to which the stream is directed. As the cesium is deposited on the photocathode, electrons begin to be released from the gallium arsenide layer. The photoemission is detected by the meter 46.

After the cesium has been deposited for approximately five (5) minutes, the cesium gas flow is reduced. The photoemission from the photocathode reaches a peak level of approximately $3\times10^{-9}$ amps. This is referred to as the "cesium rise" of the cathode.

The flow of oxygen is then started through inlet 45. As the oxygen becomes deposited on the cesium layer, an oxidation reaction occurs, transforming the cesium layer into a layer of cesium oxide. Deposition continues for approximately 25 minutes. With the start of flow of the oxygen, the photoresponse of the cathode begins to increase. A peak level of approximately 1300–1400 microamps per lumen is reached. At that point, the flow of oxygen is stopped and the deposition halted.

If a reading is not obtained on the meter as the cesium is being deposited, the deposition process is aborted, and the photocathode is classified as a reject due to "no cesium rise." However, the specific reason for the lack of photoemissive activity is not generally known. For example, the lack of photoresponse may be due to any one or more of three reasons: (1) lack of contact between the photocathode and the holder thereby preventing power from reaching the photocathode to initiate photon conversion, (2) lack of cesium being released from the compound and (3) contamination of the cathode which prevented deposition.

By means of the apparatus and process of this invention, it is possible to eliminate one possibility by determining whether or not the photocathode is contacting the holder and is being provided with electrical power.

Figure 3:
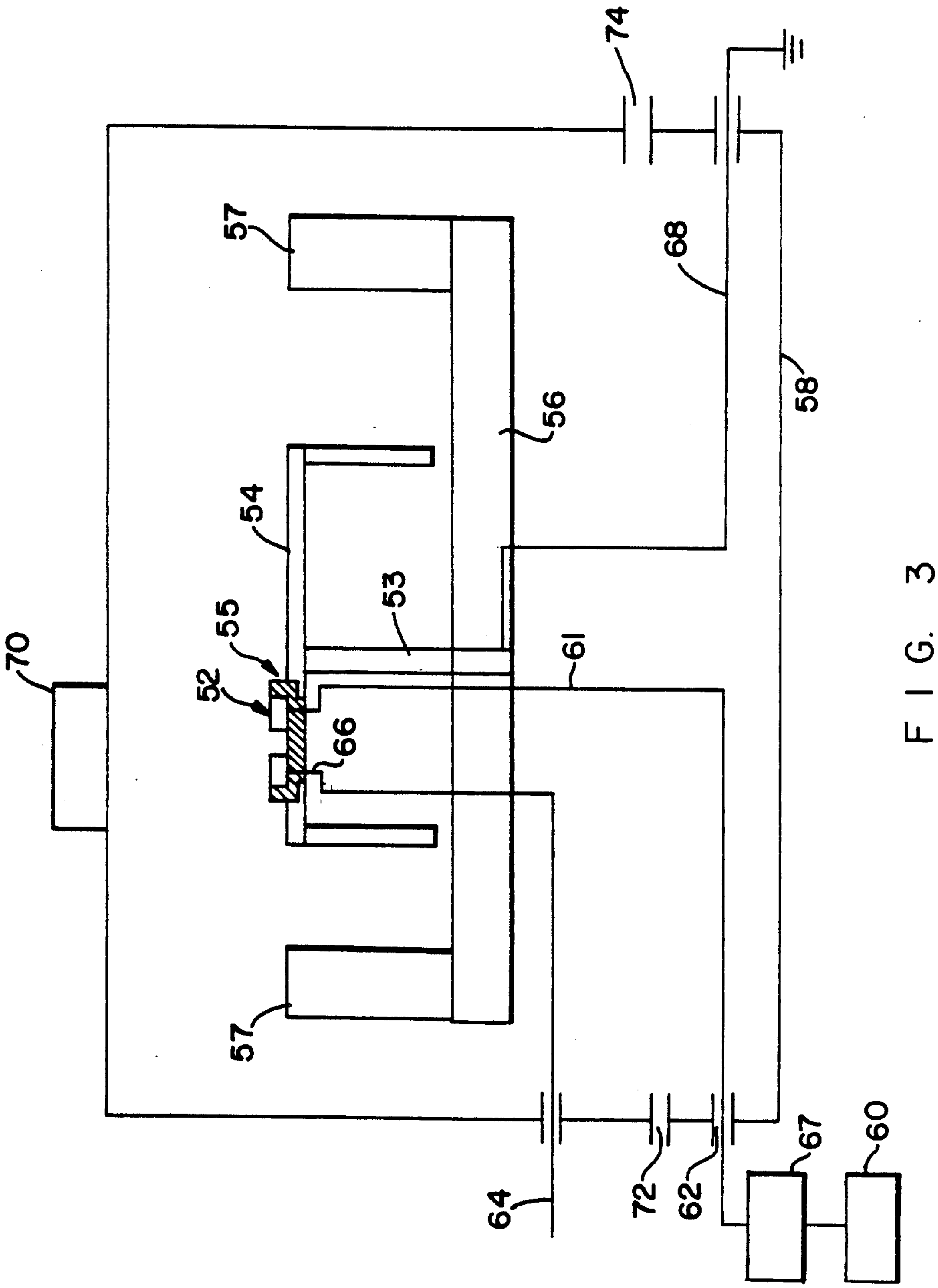
FIG. 3 is a diagrammatic view of the deposition apparatus in accordance with the present invention.

FIG. 3 shows in diagrammatic form the deposition apparatus of the present invention.

A vacuum chamber 58 contains a carousel 56 which is made of an electrically conductive material. The carousel 56 is rotated by means not shown to permit several processing steps to take place in the chamber. Twelve body holders are located around the outer periphery of the carousel 56. Side views of two such body holders are shown at 57. Each body holder contains a complete image intensifier device except for the photocathode. A process tray 54 is located in the center of the carousel 56. The tray does not rotate and is supported in the carousel 56 by means of a stand 53.

A split-ring holder 52 is located in the process tray 54. The holder is held in the process tray 54 by means of a support 55.

Electrical connection is made from a dc power source 60 to the split-ring holder 52 by means of a lead 61 extending into the chamber 58 via a feed-through 62. An electrical contact wire or fork 64 enters the chamber 58 through a feed-through in the chamber wall and is movable so as to be in and out of contact with a lead 66 extending from the split-ring holder 52. The process tray 54 is connected to ground by a lead 68 entering the chamber wall via a feed-through. A meter 67 is connected into the lead 61 to measure photoresponse.

A light source 70 is positioned in a window of the chamber 58 so that light emanating from the source shines directly on a photocathode in the chamber which is rotated into position beneath the light.

An inlet port 72 and an inlet port 74 feed cesium and oxygen respectively into the chamber 58.

Figure 4:
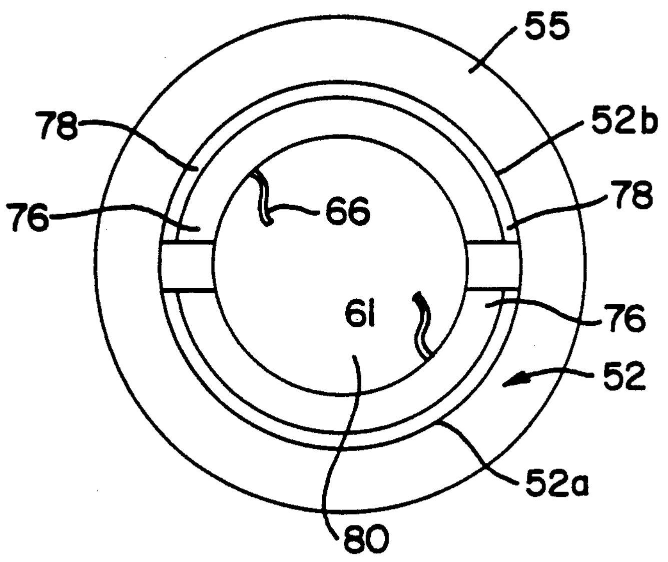
FIG. 4 is a top view of the holder of FIG. 3.

The split-ring holder 52 and support 55 will be described in more detail with reference to FIG. 4 which is a top view thereof. The split-ring holder 52 is made of an electrically conductive material. It is preferably divided into two halves 52a and 52b which are spaced from each other in order to provide electrical isolation between the halves. Although two halves have been shown, any configuration which accomplishes electrical isolation between sections of the holder 52 is acceptable.

The lead 61 is connected to the section 52a and lead 66 is connected to section 52b. Each of the halves 52a and 52b has a bottom or seat portion 76 which surrounds a central opening 80. A side wall 78 extends perpendicularly from each of the seat portions. The holder 52 has a diameter which is slightly greater than the diameter of a photocathode.

The support 55 is formed of an electrically non-conductive material, preferably ceramic. It serves to electrically isolate the conductive split-ring holder 52 from the electrically conductive process tray 54.

Figure 5:
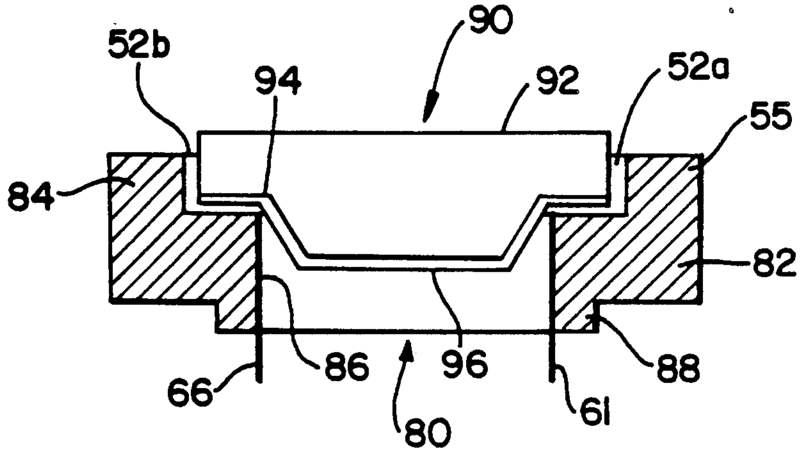
FIG. 5 is a cross-sectional view of the holder and support of FIG. 3.

FIG. 5 is a cross-sectional view of the split-ring holder 52 and the support 55. The support 55 has a ring-shaped bottom section 82 and a side wall 84 which extends perpendicularly from the bottom section 82. The side wall 84 has an inner circumference which is dimensioned to hold the split-ring holder 52. A flange 88 extends from the bottom section 82. The ring-shaped bottom section 82 and the flange 88 have a coextensive interior wall 86 which surrounds the central opening 80. The bottom section 82 and flange 88 are dimensioned to fit into an opening in the process tray 54. The support 55 extends above the surface of the tray 54 so that the holder 52 is positioned approximately one inch above the tray surface.

Leads 61 and 66 extend into the central opening 80 and connect, respectively, to the halves 52a and 52b of the split-ring holder.

FIG. 5 shows the positioning of a photocathode 90 in the split-ring holder 52. The photocathode 90 has a faceplate 92 which is directed upwardly and a conductive contact layer 94 which contacts the bottom sections 76 of the split-ring holder 52. A photoemissive wafer 96 extends downwardly into the central opening 80.

The deposition process includes the placing of twelve image intensifier tubes, without photocathodes, in the body holders 57 at one time. This is done by opening the main chamber 58. The photocathodes are introduced, one at a time, into the chamber 58 through a gate valve. As the processing of each tube is completed, from cathode activation to final seal to one of the tube bodies, it is removed from the chamber 58 through a gate valve, and another cathode is inserted into the chamber and the process repeated.

In the vacuum chamber 58, the photocathode is checked to determine if the conductive contact layer 94 is in physical contact with the conductive split-ring holder 52 so that electrical current can be supplied to the photocathode during deposition to determine photoresponse.

This is done by first sending current from the −300 V dc power source 60 via the lead 61 to section 52a of the split-ring holder 52. The fork 64 is then touched to the lead 66 which is connected to section 52b. If current is fed to the fork 64, then electrical contact has been made between the photocathode and the holder 52. Any other method of determining electrical contact may be used. For example, a relay may be used to connect one section of the split-ring holder to ground.

Thus, one possible reason for lack of photoresponse is eliminated even before deposition begins.

Referring to FIG. 3, deposition takes place in a manner similar to that described with reference to FIG. 2. Cesium and oxygen enter the chamber through inlets 72 and 74, respectively. The meter 67 monitors photoresponse.

A concomitant advantage results from isolating the holder from the process tray; that is, there occurs a much lower leakage to ground through the lead 64. In this way, the potential being supplied to the photocathode remains at a peak level.

During deposition, if there is "no cesium rise", since lack of power to the wafer has been eliminated as a possible cause, it can be determined if cesium is being released into the chamber. This is done by increasing the temperature surrounding the reservoir containing the cesium compound in an effort to initiate or increase amounts of cesium being released from the compound.

Thus, by an orderly elimination of possible reasons for photoemission failure during deposition, the number of rejects is substantially lowered.

As a result of determining electrical continuity to the photocathode before deposition begins, the percentage of rejects has been greatly reduced.

While I have described above the principles of my invention in connection with specific apparatus, it is to be clearly understood that this description is made only by way of example and not as a limitation to the scope of my invention as set forth in the objects thereof and in the accompanying claims.

What is claimed is:

1. Apparatus for activating a photoemissive layer on a photocathode, the photocathode having an electrically conductive layer surrounding a portion of the outer surface thereof and contacting the photoemissive layer, comprising:

a holder having at least first and second substantially co-planar sections composed of an electrically conductive material, and a third electrically insulating section interposed between said first and second sections, said holder being dimensioned such that when the photocathode is positioned in the holder the electrically conductive layer is on said sections;

a support for said holder, said support being composed of an electrically nonconductive material and surrounding at least said first and second holder sections;

means joined to one of said first or second sections of said holder for conducting electrical current to said section; and means joined to the other of said first or second sections for indicating the presence of an electrical current in said other section when current is passed through said conducting means, said indicating means being determinative of the contact between said holder and the electrically conductive layer of the photocathode.

2. The apparatus of claim 1 further comprising a tray formed of a conductive material into which said support is seated.

3. The apparatus of claim 2 further comprising a ground potential coupled to said tray.

4. The apparatus of claim 1 wherein said support is made of ceramic.

5. The apparatus of claim 1 wherein said third section is air.

6. The apparatus of claim 1 wherein said third section is a non-conductive material.

7. The apparatus of claim 1 wherein said indicating means is a relay coupled to a ground potential.

8. The apparatus of claim 1 wherein said indicating means is a movable fork coupled to a electrical potential which is lower than the electrical potential applied to one of said first or second sections.

9. A method of forming an activation layer on a photocathode comprising the steps of:

making a holder having at least two electrically conductive sections, each of the sections being electrically isolated from each other;

placing the photocathode on the holder such that the electrically conductive sections of the holder are in contact with portions of a metallic section of the photocathode; and directing an electric current to two electrically conductive sections in order to determine whether the electrically conductive sections of the holder are in contact with portions of a metallic section of the photocathode.

10. The method of claim 9 further comprising the step of setting the holder in a vacuum chamber.

11. The method of claim 10 further comprising the step of introducing a cesium compound into an inlet section of the chamber after said placing step.

12. The method of claim 11 further comprising the step of applying a source of heat to the inlet section to cause cesium gas to be released from the compound and be deposited on the photocathode.

13. The method of claim 12 further comprising the step of determining if the cesium deposition has occurred after performing the applying step.

* * * * *